United States Patent [19]

Nakata

[11] Patent Number: 5,502,729
[45] Date of Patent: Mar. 26, 1996

[54] METHOD OF TESTING FOR STUCK-AT FAULT IN A SYNCHRONOUS CIRCUIT

[75] Inventor: Tsuneo Nakata, Kawasaki, Japan

[73] Assignee: Fujitsu Limited, Kawasaki, Japan

[21] Appl. No.: 10,180

[22] Filed: Jan. 28, 1993

[30] Foreign Application Priority Data

Jan. 28, 1992 [JP] Japan .................................. 4-012742

[51] Int. Cl.$^6$ .................................................. G01R 31/28
[52] U.S. Cl. .................................................. 371/22.3; 371/27
[58] Field of Search .................................. 371/22.3, 22.1, 371/22.4, 25.1, 62, 69.1, 23, 27

[56] References Cited

U.S. PATENT DOCUMENTS

| | | | |
|---|---|---|---|
| 4,204,633 | 5/1980 | Goel | 371/27 |
| 4,493,077 | 1/1985 | Agrawal et al. | 371/25 |
| 4,534,028 | 8/1985 | Trischler | 371/25 |
| 4,601,032 | 7/1986 | Robinson | 371/23 |
| 4,852,093 | 7/1989 | Koeppe | 371/23 |
| 5,043,985 | 8/1991 | Lin et al. | 371/22.3 |
| 5,172,377 | 12/1992 | Robinson et al. | 371/22.3 |

*Primary Examiner*—Robert W. Beausoliel, Jr.
*Assistant Examiner*—Norman M. Wright
*Attorney, Agent, or Firm*—Staas & Halsey

[57] ABSTRACT

The time series test pattern is generated by applying a system clock to the synchronous circuit. By expanding the synchronous circuit into a plurality of combinational circuit. The internal input to the combinational circuit is changed without applying the system clock to the synchronous circuit and the output of the combinational circuit is observed to determine whether the test pattern including the primary input enables to be detected. When the test pattern and extended test pattern are determined, they are applied to the synchronous circuit to detect a fault. The extended test pattern is formed by applying random number to the primary input and by performing a fault simulation based on the random number. The extended test pattern can be also cleared by using a conventional algorithm for finding the test pattern.

13 Claims, 12 Drawing Sheets

<TIME T0>

FAULT INSERTION; IMPLICATION

FIG. 11A

BACK TRACK

FIG. 11B

COMPLETION OF PROCESS

FIG. 11C

METHOD OF TESTING FOR STUCK-AT FAULT IN A SYNCHRONOUS CIRCUIT

BACKGROUND OF THE INVENTION

The present invention relates to a method of testing for stuck-at faults of a synchronous sequential circuit. When an electronics circuit comprising a synchronous circuit for use in a partial-scan method or non-scan is manufactured, it is tested for a stuck-at fault in which a logic value of a signal line in the circuit is permanently stuck at "1" or "0".

Figure 1:
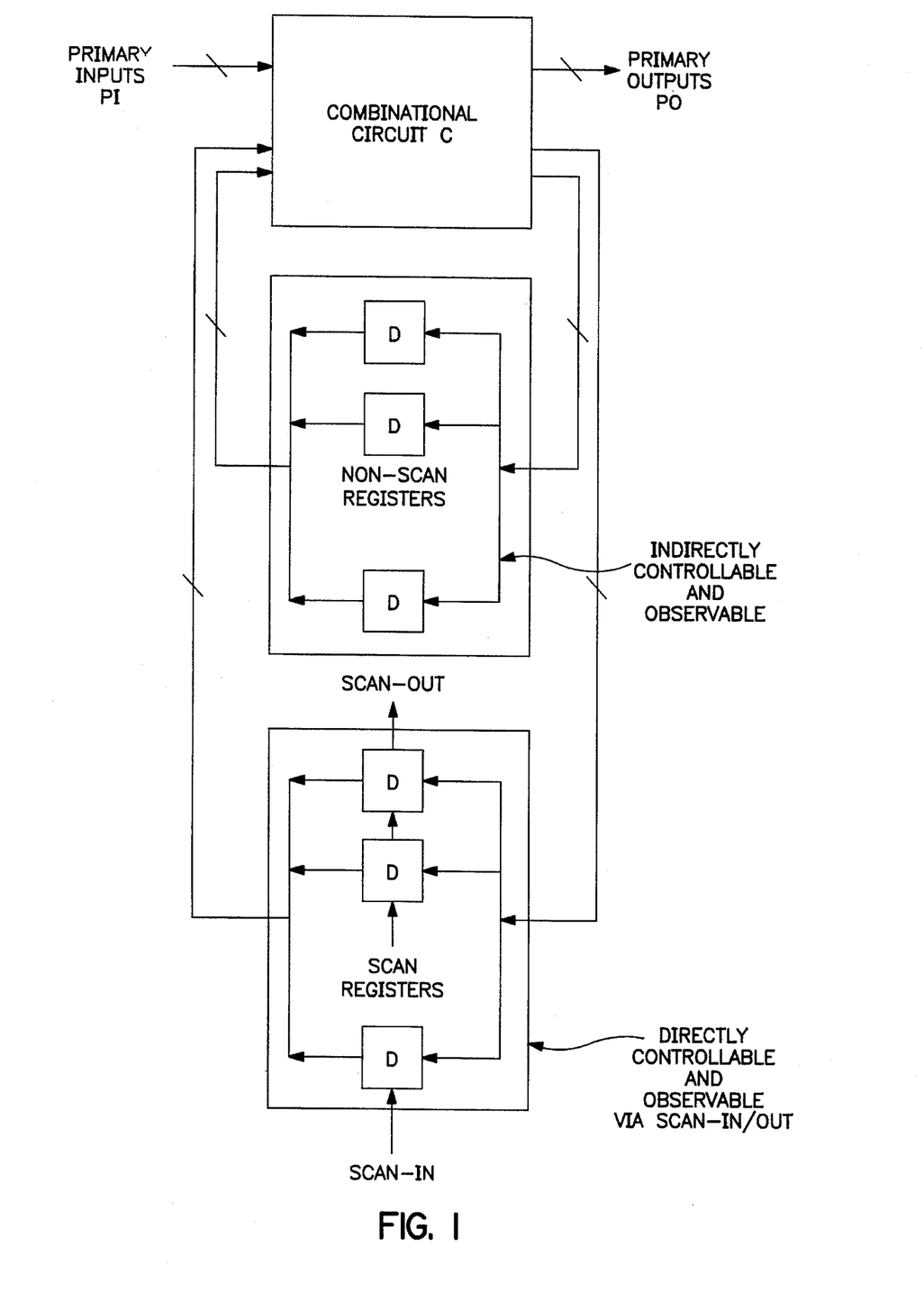
FIG. 1 shows a block diagram of a partial scan-in circuit including a non-scan circuit.

As shown in FIG. 1, a partial scan circuit has a memory element portion which includes non-scan registers and scan registers.

The non-scan registers are treated as pure internal registers and, except for initialization, the input or output value of registers can be set or observed indirectly through the operation of the sequential circuit.

The scan registers, also internal, are simultaneously connected by a test path. It is possible to set or observe the value of the scan register from a test terminal. A testing sequence comprises a setting of a scan register, values, (scan-in), a setting of the primary input, a clocking of the system clock, an observation of the primary output and an observation of the scan register values (scan-out). A full scan circuit does not include non-scan registers and thus can apply a method adopted to a combinational circuit to a test pattern generation. However, in the partial scan circuit, it is necessary to apply a method adapted for a sequential circuit to a test pattern generation. In the full scan circuit, one test pattern is sufficient for detecting one fault. In contrast, in the partial scan circuit, a test pattern sequence becomes necessary for each fault, i.e., the sequential circuit must be expanded in a time direction or extended over time.

The non-scan circuit does not have any scan registers in the partial scan circuit. Therefore, it naturally requires a method adapted for a sequential circuit, such as extending the sequential circuit in a time direction, and requires a time sequence test pattern when the test pattern is generated.

The present invention is directed to a non-scan circuit and a partial-scan circuit and therefore, when the test pattern is generated, the sequential circuit is extended in a time direction.

A defective item in a circuit product including the sequential circuit is specified as the result of the test, and the reliability of the circuit product can be raised by removing the defective item. A test for a stuck-at fault of a sequential circuit, i.e., a synchronous circuit, is performed, in the case of a full scan method, by inputting a scan-in signal into and outputting a scan-out signal from a scan path comprising all the memory elements provided in the synchronous circuit. When a partial scan or non-scan method is used instead of a full scan, some memory elements are not scanned. Thus, in order to test a memory element which has not been scanned, the synchronous circuit should be expanded into a plurality of combinational circuits over time. Specifically, a test pattern generation for a stuck-at fault of a synchronous circuit for use in a non-scan or a partial scan method is performed by expanding the synchronous circuit into a plurality of combinational circuits which are aligned along the time axis. Consequently, a process of time expansion is performed, and test patterns for respective combinational circuits are formed by examining the non-detected faults of respective combinational circuits, thereby performing a process of generating test patterns. Moreover, a primary output of a combinational circuit is observed after supplying respective test patterns to the corresponding combinational circuit sequentially.

Figures 2A, 2B:
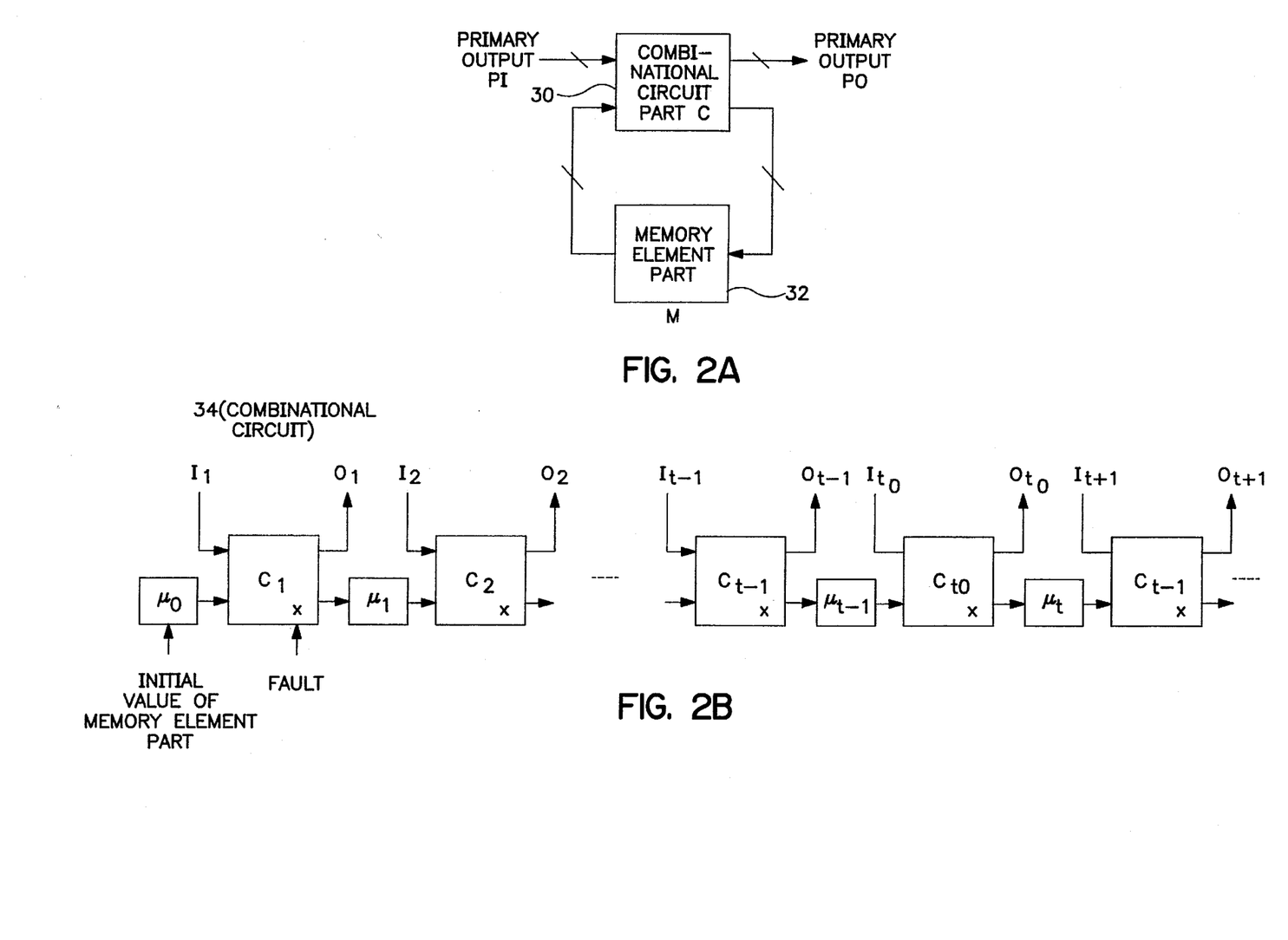
FIG. 2A shows an explanatory view of a synchronous circuit model.
FIG. 2B shows an explanatory view of an iterative expansion of a synchronous circuit over time.

FIG. 2A shows a simplified model of a synchronous circuit for use in a non-scan or a partial scan method which comprises a combinational circuit part (C)1 and a memory part (M)2.

A primary input PI is provided to the combinational circuit 1 and a feedback loop is formed between the combinational circuit part 1 and the memory element part 2. A primary output PO is obtained from the combinational circuit part 1.

FIG. 2B is a conceptual view showing the iterative expansion of the model. In order to break the feedback loop shown in FIG. 1, combinational circuits 34 (c1, c2 ... ct–1, ct0, ct+1 ...) are generated at respective times ti (i=i1, i2 ... it–1, it0, it+1 ...). External inputs i1, i2 ... it–1, it0, it+1 ... and primary outputs o1, o2 ... ot–1, ot0, ot+1 .. . of combinational circuits 34 (c1, c2 ... ct–1, ct0, ct+1 .. .) at respective times t form primary input PI and primary output PO in the model shown in FIG. 2B.

All flip-flops are replaced by the equivalent logic gates and the D flip-flop has its affirmative output replaced simply by a signal line and its negative output by an inverter.

As a result, a combinational circuit having the same operation as the synchronous circuit shown in FIG. 2A is constructed. Usually, the subject of a test is a single fault, but multiple faults may be the subject of the test when this expansion of a synchronous circuit is performed.

When the model is expanded over time, as described above, then after multiple faults are inserted, test pattern generation algorithms for combinational circuits, for example, the D algorithm or PODEM method, are applied to obtain input values of the circuit and to provide the input values in a time series again. This forms a test pattern to be input to the primary input i1, i2 .... it–1, it0, it+1 of the model.

Respective input values (i1, i2 ... it–1, it0, it+1 ...) of the test pattern are applied to the corresponding combinational circuit 34 (c1, c2 ... ct–1, ct0, ct+1 ....) at respective times and the primary outputs (o1, o2 .... or–1, ot0, ot+1 ....) of the combinational circuit 34 (c1, c2 ... ct–1, ct0, ct+1 ...) are observed at the respective times t, so that the existence of a fault may be determined.

Figure 3:
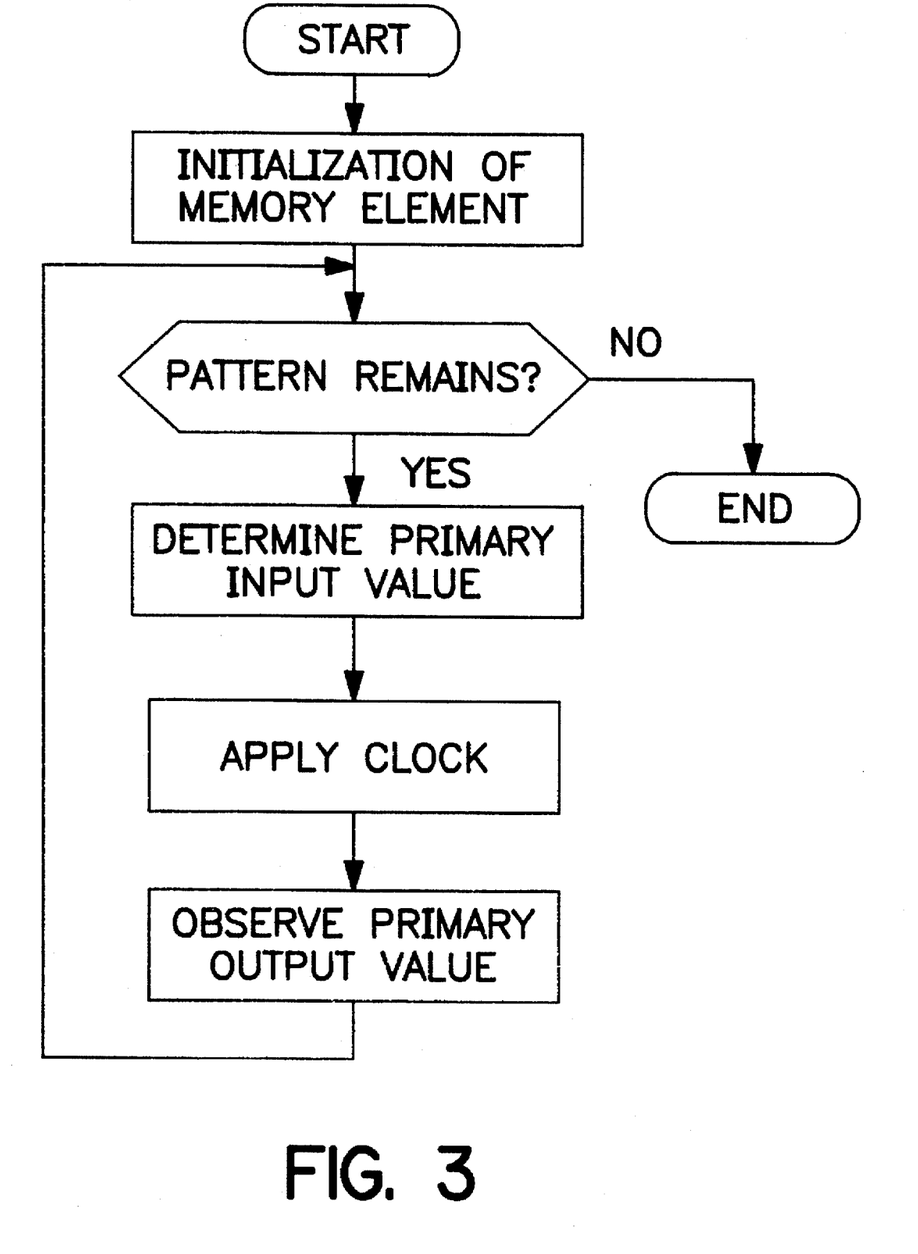
FIG. 3 shows a flowchart for explaining a conventional test sequence.

When a test pattern is obtained for a particular fault, a sequence of pattern setting, clocking, and output value observation is repeated a number of times equal to the number of patterns after the memory element is initialized, as shown in FIG. 3.

Figure 4A:
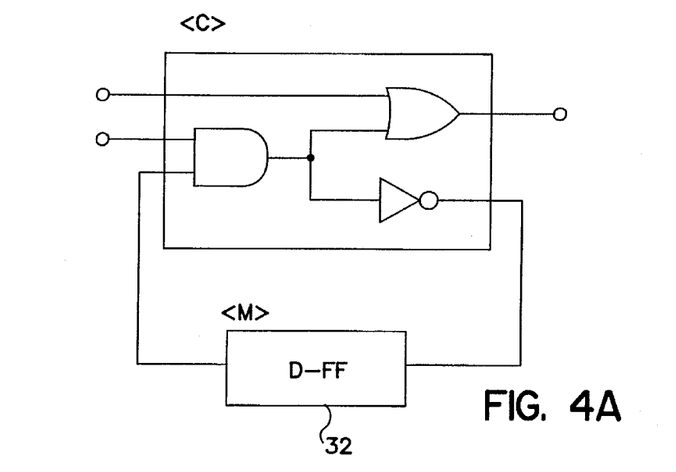
FIG. 4A shows a synchronous circuit model.
Figure 4B:
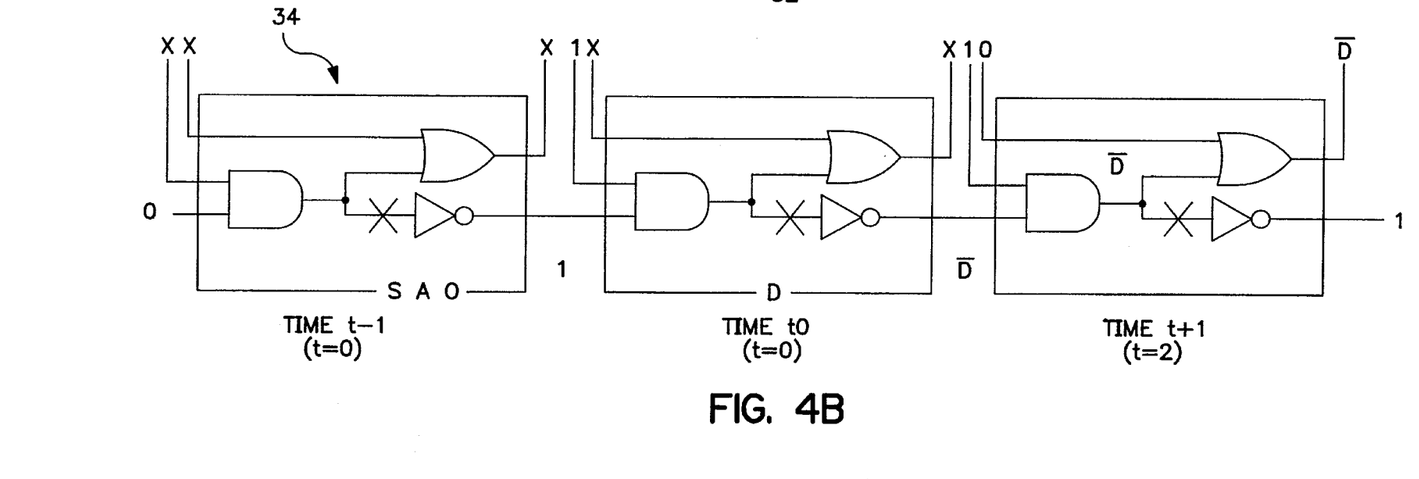
FIG. 4B shows an explanatory view of generation of a test pattern by iterative expanding a synchronous circuit over time.

FIGS. 4A and 4B show generation of a test pattern with more specificity. By performing a repeated expansion of the circuit shown in FIG. 4A, three combinational circuits 34 which are aligned along the time axis, as shown in FIG. 4B, are formed.

When test pattern generation algorithms for combinational circuits, for example, the D algorithm or PODEM method, are applied to this circuit for the purpose of detecting a fault at time t, i.e., a single fault at the input of the inverter, an input value (x, 1, 1) is obtained and the output value is x, D. The same process is performed for times t–1 and t+1 to set the value "1" at the input and provide the output D to the external unit. Then, input values (x, x, D) and (0, 1, D) are respectively obtained.

In this case, the condition required for the flip-flop value at time t–1 is satisfied regardless of the initial value of D-FF (D-Flipflop) 4; thus, this is determined to be the initial state.

Further, the above test pattern is provided in a time series and a final test pattern, in which the input pattern becomes (x, x), (x, 1), (0, 1) at respective times 0, 1 and 2, is produced with respect to the fault in question. More specifically, a single fault at the input of the inverter.

In order to perform a test for multiple faults which covers all the faults of a circuit, the process recited above is performed for respective faults. Then, the scale of a subject circuit becomes several times that of the synchronous circuit due to the iterative expansion and thus, the volume of processing for the circuit under test becomes extremely large.

Therefore, when a test pattern for a particular fault is obtained, a fault simulation is performed to obtain all the faults that can be detected simultaneously by the same test pattern. Then, the fault test is performed. The same process is repeated for the following tests and is repeated to find faults which have not yet been detected, as shown in FIG. 3.

When an iterative expansion is performed with regard to the synchronous circuit for use with a non-scan method, the circuit scale after expansion becomes more than several times that before expansion and the volume of processing for generating the test patterns increases exponentially with the increase of the circuit scale in the worst case and increases, on the order of a power of two in the average case, with the circuit scale. Thus, the volume of processing becomes several tens or several hundreds of times that for a combinational circuit.

With an increase of the circuit scale, the number of selections occurring during the generation of the test patterns increases and the number of back tracks increases. As a result, the processing time per fault is increased. As the time for testing may be limited, the test is often stopped before completion if a large scale is involved. Therefore, many faults which could, in theory, be detected remain undetected.

For a synchronous circuit for use in a partial scan method, some of the memory element values can be replaced by a scan register which can be accessed externally. Thus, the ease of observation and control of the partial scan for a synchronous circuit is improved compared to a non-scan synchronous circuit.

However, the partial scan circuit includes many non-scanned memory elements and therefore, in the case of a large scale circuit, an extensive amount of time is required for generating test patterns. Consequently, it becomes difficult to raise the fault detection ratio due to the limitation of the test time.

SUMMARY OF THE INVENTION

An object of the invention is to raise the practical fault detection ratio by shortening the time required for a fault test.

The first feature of the present invention resides in a method of testing for stuck-at fault of a synchronous circuit comprising a memory element and a combinational circuit. The method includes expanding a synchronous circuit into a plurality of combinational circuits which are aligned over time and generating a test pattern for each of the combinational circuits. The test pattern has an input value input to the combinational circuit from the memory element and a primary input value input to each combinational circuit. The test pattern used to detect a fault is applied to each combinational circuit. The test pattern is formed in a sequence in the order in which the test pattern is applied to each synchronous circuit over time. The method also includes generating the primary input value for detecting other faults with regard to the test pattern in the time series under the condition that the input to be applied from the memory element is fixed; supplying the test pattern in the time series to the input from the memory element and the primary input of the combinational circuit sequentially; sequentially supplying the test pattern to the primary input of each combinational circuit with the value of the input from the memory element fixed when the test pattern is applied to the input from the memory element and primary input of the combinational circuit; and referring to a primary output of the combinational circuit when the test pattern is applied to the input from the memory element and the primary input of the combinational circuit.

The second feature of the present invention resides in applying the above method to a partial-scan or non-scan testing method.

The third feature of the present invention resides in the method in which the primary input generating step generates a primary input value by generating a random number to perform a fault simulation of the combinational circuit by using the random number.

The fourth feature of the present invention resides in the method in which the primary input generating step generates the primary input value in the same manner as the test pattern is generated.

The fifth feature of the present invention resides in a method of testing for the generation fault of synchronous circuit which includes a memory element and a combinational circuit. A test pattern sequence is provided to the synchronous circuit by applying a system clock signal thereto determining whether a fault can be detected by using a time series test pattern. A primary input value is changed with regard to the time series test pattern without applying the system clock to the synchronous circuit, thereby extending the time series test pattern. The extended time series test pattern is applied to the synchronous circuit and also to the synchronous circuit without applying the system clock to the synchronous circuit. A first primary output value is observed from the combinational circuit and the first primary input value is determined based on the observation of said primary output value by applying the system clock to the synchronous circuit. A second primary output value is observed by applying the system clock to the synchronous circuit when the system clock is applied to the combinational circuit.

The sixth feature of the present invention resides in a method of testing for the generation of a fault of synchronous circuit which includes a memory element and a combinational circuit. A test pattern sequence is provided to the synchronous circuit by applying a system clock signal thereto, determining whether a fault can be detected by using the test pattern sequence, and changing a primary input value with regard to said test pattern sequence without applying the system clock to the synchronous circuit, thereby extending the time series test pattern sequence.

BRIEF DESCRIPTION OF THE DRAWINGS

One skilled in the art can easily understand additional features and objects of this invention from the description of the preferred embodiments and some of the attached drawings. In the drawings.

DESCRIPTION OF THE PREFERRED EMBODIMENTS

Figure 5:
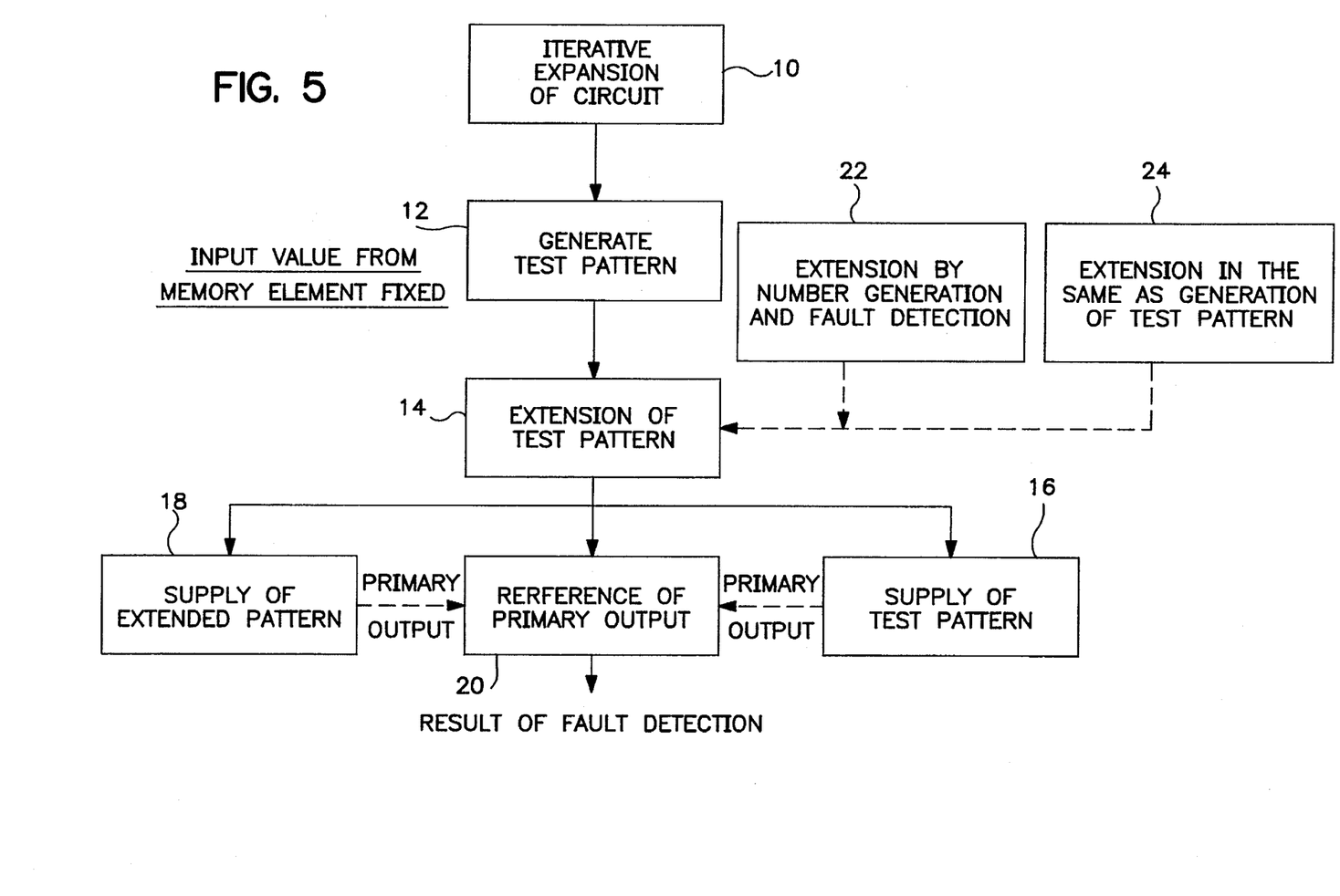
FIG. 5 shows an explanatory view of the present invention.

FIG. 5 shows a principle of the present invention. In a method of testing for stuck-at faults of a synchronous circuit including a memory element and combination circuit, the test pattern generation is performed by expanding a synchronous circuit into a plurality of combinational circuits which are aligned over time (at step 10). A test pattern is generated for each of the combinational circuits. The test pattern comprises an input value for each of the combinational circuits from the memory element and a primary input value for each of the combinational circuits. The test pattern is used for detecting a fault by applying the test pattern to the combinational circuit, the test pattern is formed in a sequence in the order in which the test pattern is applied to the synchronous circuit over time (at step 12). The test pattern generates the primary input value for detecting other faults with regard to the test pattern in a sequence when the input, to be applied from the memory element, is fixed, i.e., when the synchronous circuit is expanded to a combinational circuit (at step 14). Then the test pattern in the time series is supplied to the input from the memory element and the primary input of each combinational circuit sequentially (at step 16). The test pattern is sequentially supplied to the primary input of the combinational circuit with the value of the input from the memory element fixed when the test pattern is applied to the input from the memory element and primary input of the combinational circuit (at step 18). A primary output of the combinational circuit is then referred to when the test pattern is applied to the input from the memory element and the primary input of the combinational circuit (step 20).

According to this feature, a process of iterative expansion and a process of generation of test pattern are performed and a fault test is conducted. The respective test patterns are supplied to an input from a memory element and a primary input of the corresponding combinational circuit in a sequential manner, as shown in steps 10, 12 and 16. These steps are the same as the conventional procedure.

However, with regard to respective test patterns, under the condition that the values supplied to the input of the combinational circuit from the memory elements are fixed, the values of primary inputs for detecting a fault upon fault testing, i.e., all the values previously generated for the combinational circuit, are changed and input to the primary input with the input value from the memory element to the combinational circuit fixed at step 18. At this time, and at the time of supplying the test pattern, the primary output value is referred to at step 20. As a result, one fault is detected by supplying respective test patterns to the combinational circuit and the other faults are also detected by changing the values of the primary input upon supplying a new test pattern.

When the test pattern for fault detection is generated, a kind of pattern for extending this test pattern with regard to the primary input values is also prepared.

Therefore, faults are effectively prevented from going undetected and a large amount of test pattern generation processing is prevented from being repeated due to an undetected fault, thereby shortening the time required for the test.

Therefore, fault testing of a large scale circuit can be completed within a limited time and, as a result, the fault coverage is increased.

With regard to all the test patterns, a random number is generated under the condition that the values supplied to the combinational circuit from the corresponding memory element are fixed and a fault simulation of the combinational circuit is performed by using the random number as the value of the primary input.

The values of the primary input for detecting other faults are determined by the fault simulation at step 22.

The test pattern is formed, in part, by the values supplied to the primary input of respective combinational circuits and is used for detecting other faults when the value supplied from the memory element is fixed and is generated in the same manner as all the basic test patterns at step 24.

The preferred embodiment of a method for testing for stuck-at fault according to the present invention will be explained by referring to the figures.

The following embodiment will be explained primarily with regard to each of combinational circuits which are obtained by expanding a sequential circuit over time. Each operations of expanding the sequential circuit over time corresponds to an operation of obtaining the corresponding input and output response of a combinational circuit which is obtained when an input from a memory element, provided in the sequential circuit, is fixed and the primary input is provided.

GENERATION OF A TEST PATTERN

Figure 6:
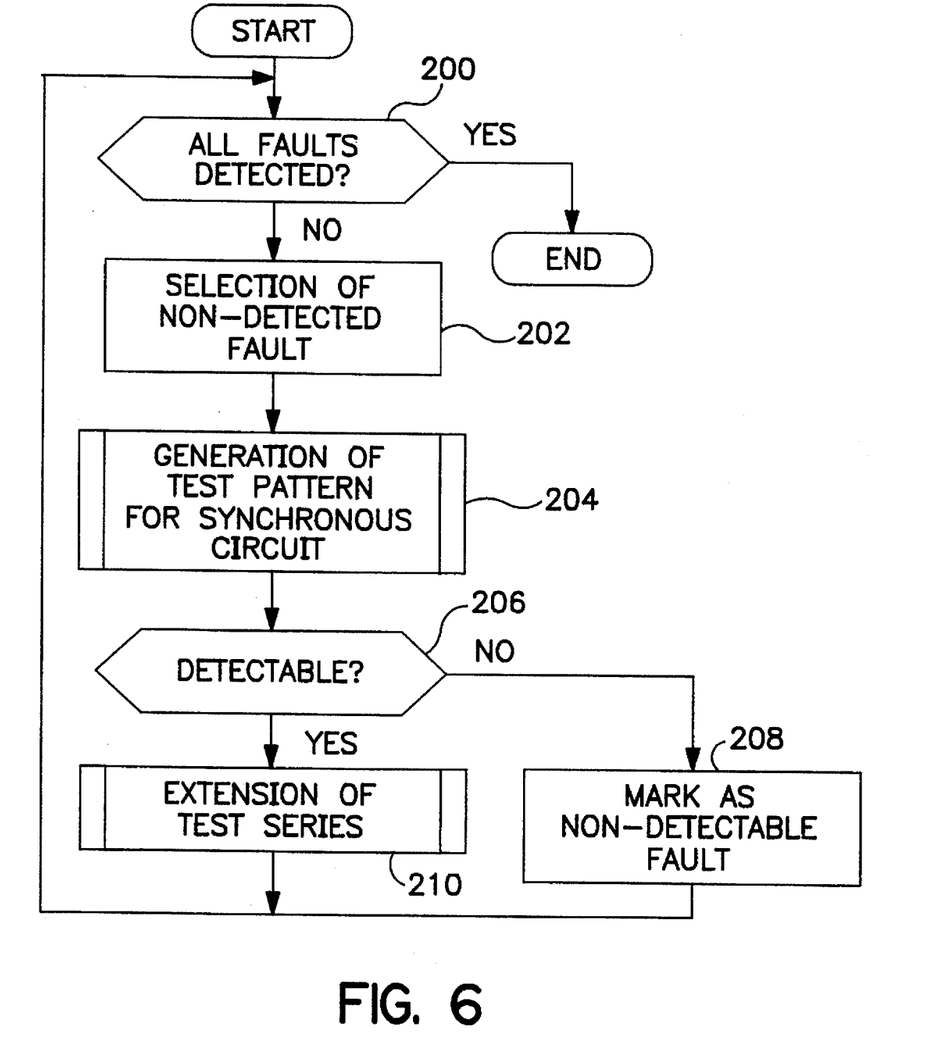
FIG. 6 shows a flowchart for explaining a sequence of generation of the test pattern according to the embodiment of the present invention.

FIG. 6 shows a flowchart of a test pattern generation sequence according to the test pattern generation method of the embodiment. When all the faults have not yet been detected in the circuit shown in FIG. 4A, i.e., NO at step 200, the 0 stuck-at fault at the inverter input is selected in the same manner as the prior art at step 202. The test pattern (the basic test pattern) is generated, thereby providing the input values (0, x, x), (x, 0, 1), (0, 0, 1) at step 204, as shown in FIG. 4B, where the primary input values are (1,1), (1,1) and (0,1).

In this embodiment, "0" is assumed as the initial value of D-FF (D-Flipflop) 4. A terminal for initializing the memory element portion M is provided in most synchronous circuits. Thus, this assumption can be considered reasonable.

Next, it is determined whether the fault is detectable using the test pattern at step 206. When the fault is not detectable (NO at step 206), it is marked as the non-detectable (at step 208). When the fault is detectable (YES at step 206), the test pattern is extended (at step 210).

EXPANSION OF THE TEST PATTERN

Time T0

Figure 7A:
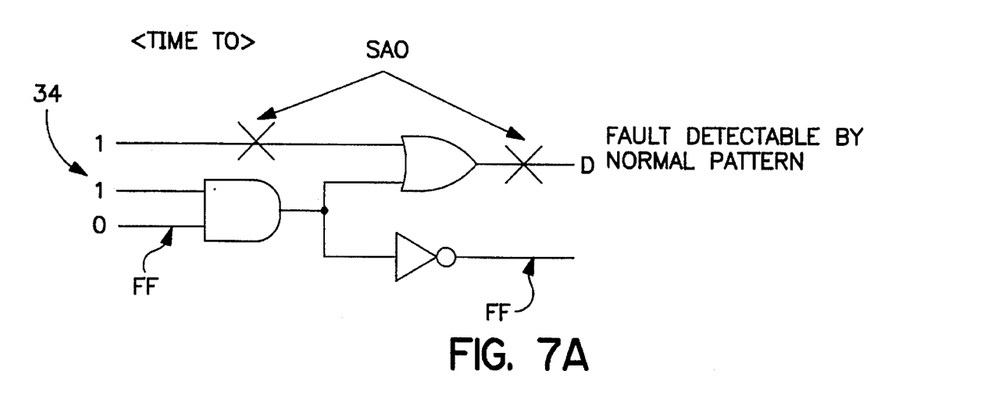
FIGS. 7A to 7C show an explanatory view of the extension of the test pattern.
Figure 7B:
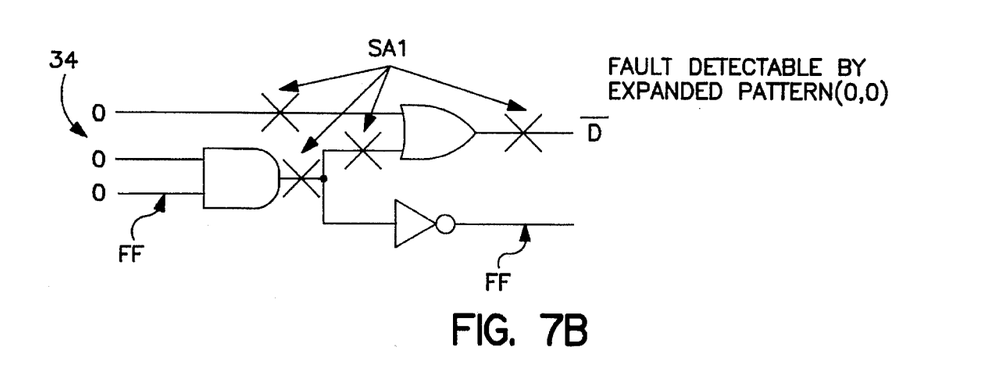
Figure 7C:
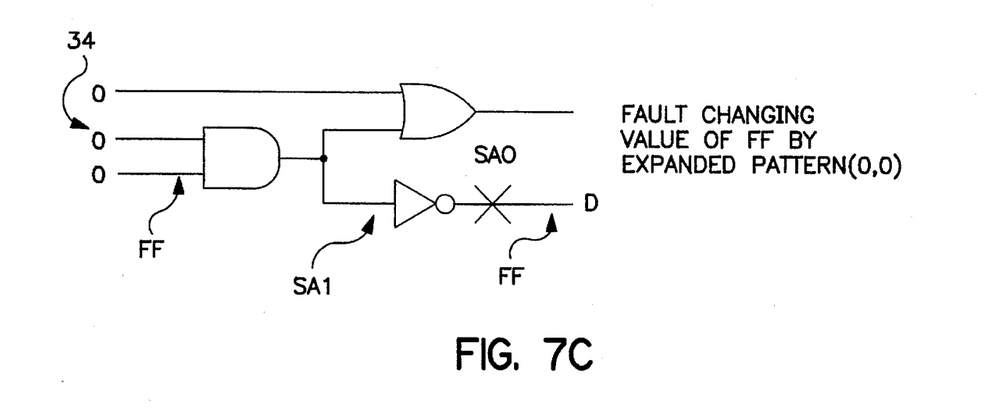

The operation of extending a test pattern at time T0 is explained by referring to FIG. 7A. The condition that values input from D-FF (D-Flipflop) 4 are fixed to be 0 is determined. Under this condition, the value to be input to the primary input is changed. FIGS. 7A to 7C refer to a 0 stuck-at fault.

When the primary input (1,1), shown in FIG. 7A, is changed, as shown in FIG. 7B, i.e., the value of the primary input or the primary input is changed to (0,0). Then, four occurrences of 1 stuck-at faults are detected at the inputs and outputs of the OR gate and the input of the inverter.

The 1 stuck-at fault at the input of the inverter and the 0 stuck-at fault at the output of the inverter, as shown in FIG. 7C, are not detected but are transferred to the next time T1 as a fault for changing the value of D-FF (D-Flipflop) 4.

Time T1

At time T1, when the primary input value (1,1) of the test pattern is changed to (0,1) or (0,0), a new fault is detected. In particular, when it is changed to the primary input value (0,1), the two faults which were transferred from time T0 are detected.

Time T2

At time T2, when the primary input value of the test pattern is either not extended or extended, a new fault cannot be detected.

A FAULT TEST USING A TEST PATTERN

Figure 8A:
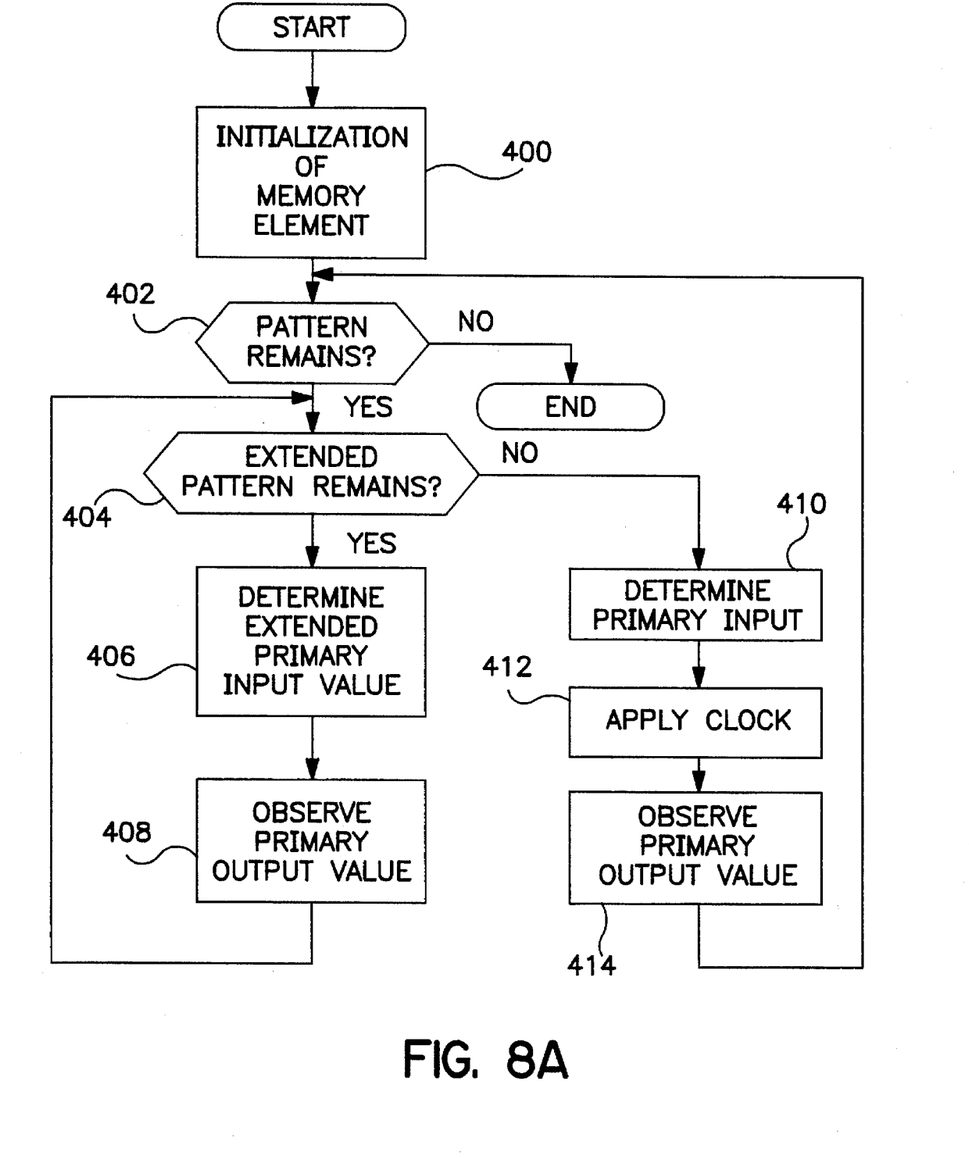
FIGS. 8A and 8B show a flowchart for explaining a test sequence according to the embodiment of the present invention.

In FIG. 8A, the sequence of a fault test is explained by referring to the flowchart. When the memory elements are initialized, for example, at step 400, it is determined whether the test pattern and extended patterns obtained by extending the primary input value remain (at step 402 and step 404).

When it is determined that a test pattern and an extended pattern remain (YES at step 404), one of the extended patterns (the primary input pattern) is selected to be output (step 406). Then, the primary output is observed (at step 408).

The selection of extended patterns and the observation of the primary output are repeated until all the extended patterns have been selected to be applied. When the last extended pattern is selected and output, and the corresponding primary output is observed, the primary input value for the test pattern is determined and applied, as shown at step 410.

When a clock is supplied at step 412 and the primary output values are observed at step 414, it is again determined at step 402 whether any test patterns remain. The same process described above will be repeated for subsequent test patterns.

The sequence of a fault test in the above case is given as follows.

- A pattern for initializing a memory element is output.
- An extended pattern (0,0) is determined at time T0 and its primary output value is observed.
- A basic pattern (1,1) is determined at time T0.
- A circuit is clocked and the primary output value is observed.
- An extended pattern (0,0) is determined at time T1 and the primary output value is observed.
- An extended pattern (0,1) is determined at time T1 and the primary output value is observed.
- A basic pattern (1,) is determined at time T1 and the primary output value is observed.
- A clock is applied in and the primary output value is observed.
- A basic pattern (0,1) is determined at time T2.
- A clock is applied and the primary output value is observed.

OBTAINING AN EXPANDED PATTERN

Figure 8B:
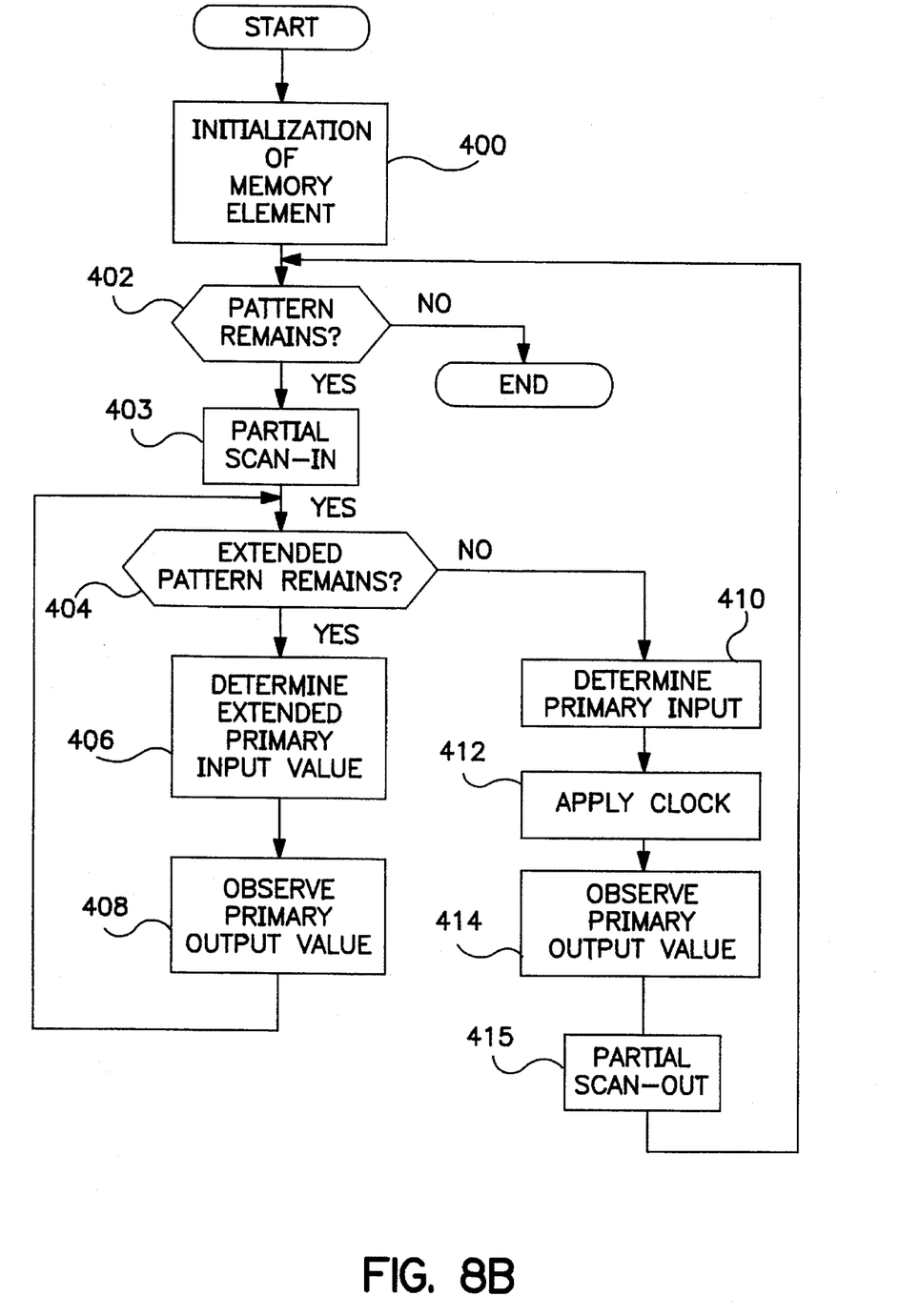

FIG. 8B shows a flowchart in which the step of performing a partial scan-in 403 and the step of partial scan-out 415 are combined with the test procedure shown in FIG. 8A. When a test pattern which is not yet processed remains (at step 402), a test pattern for the partial scan-in is entered into a scan part which connects to some part of the memory elements provided in the synchronous circuit. Thereafter, it is determined whether an extended pattern which is not yet processed remains (at step 404). After the system clock is supplied to the synchronous circuit at step 412, and the primary output value of the combinational circuit is observed, a partial scan-out process is conduced to observe the outputs of the combinational circuit which are not yet observed in step 414.

OBTAINING AN EXTENDED PATTERN

The extended pattern (a value to be supplied to a primary input) can be obtained by a method of applying a random number or a method of generating a test pattern for a combinational circuit with regard to faults which are not yet detected.

THE METHOD OF APPLYING A RANDOM NUMBER

Figure 9:
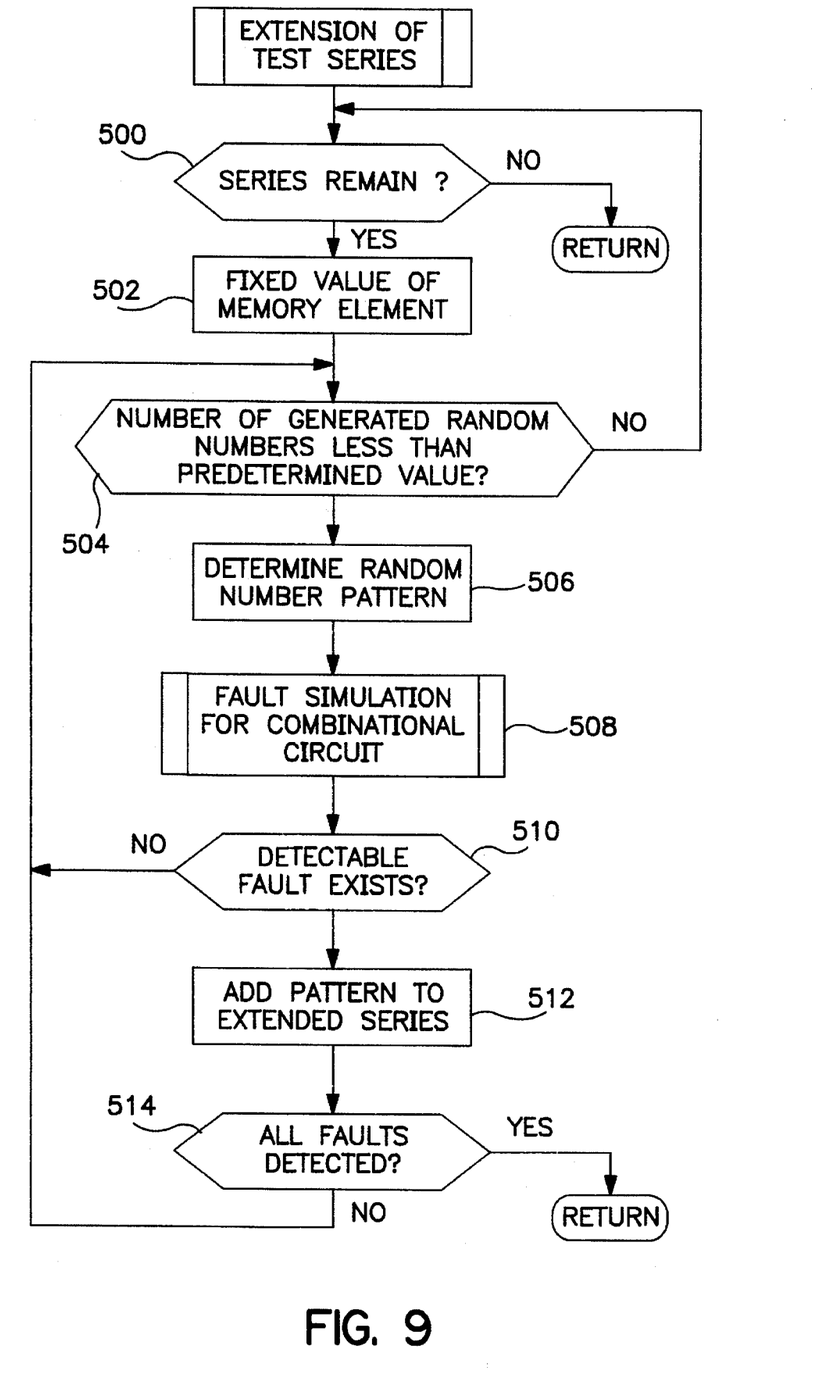
FIG. 9 shows a flowchart for explaining a sequence of extending a test pattern.

FIG. 9 shows the sequence of the process of generating a test pattern at step 500 which determine whether an unprocessed test pattern remains in time series. When existence of a test pattern is confirmed (at step 500), a memory element input value is fixed (at step 502) and the number of generated random numbers is greater than a predetermined value is confirmed (at step 504), the random number pattern is determined at step 506. A fault simulation of a combinational circuit is then performed using the determined random number pattern by applying it to the primary input (at step 508).

When it is determined, as a result of the simulation, that the fault is detectable (YES at step 510), then the random number pattern thus obtained is added to the extended pattern (at step 512). The process, including the decision for generation of the random number (at step 504), and the following steps are repeated until all the faults are detected (at step 514).

In this case, the random number is utilized for generating an extended pattern, and the amount of processing is decreased and the speed of the processing is increased greatly.

A METHOD OF GENERATING A TEST PATTERN FOR A COMBINATIONAL CIRCUIT WITH REGARD TO UNDETECTED FAULTS

Figure 10:
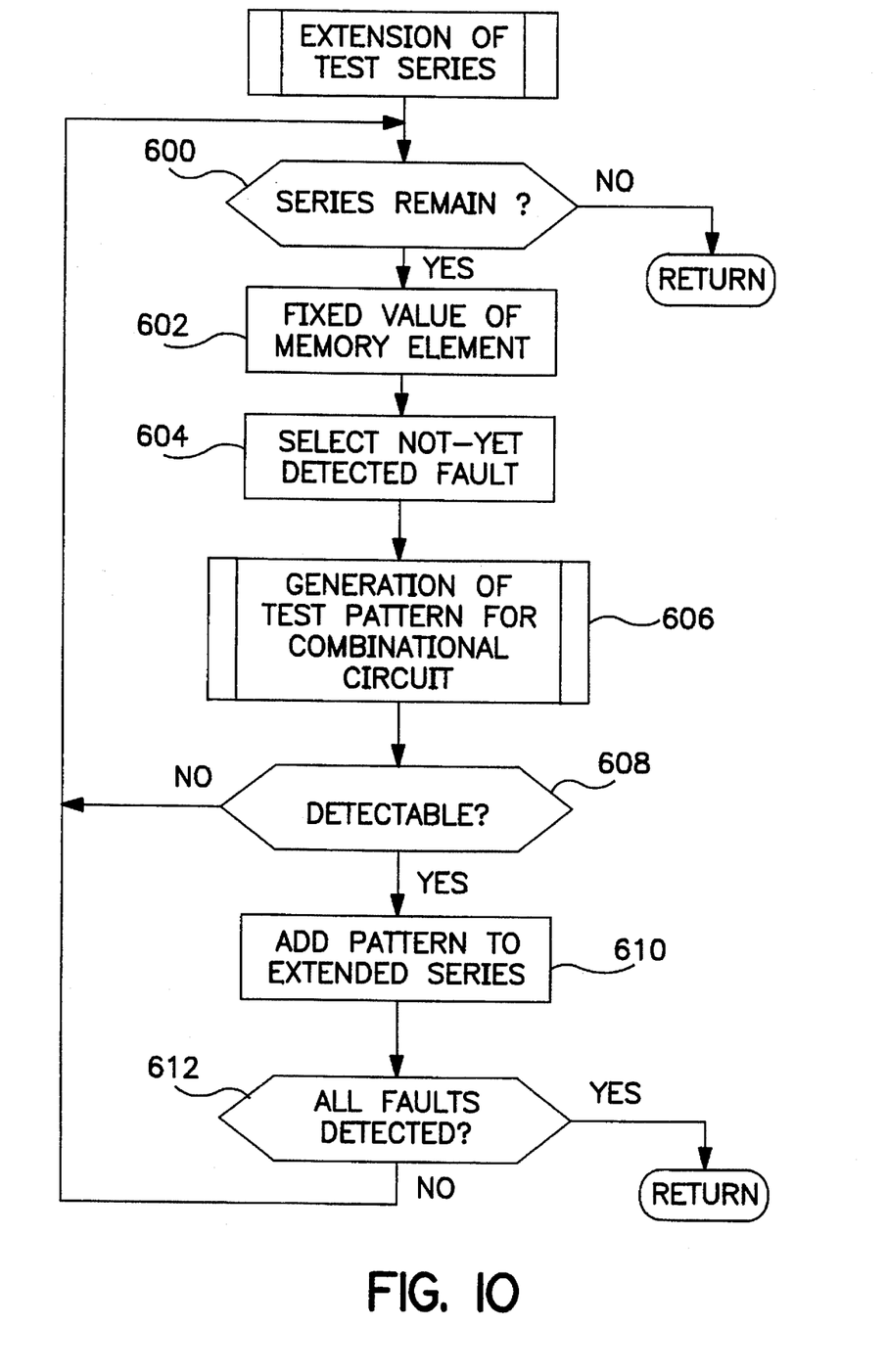
FIG. 10 shows a flowchart for explaining a sequence of an extending of a test pattern.

FIG. 10 shows the sequence of the process of generating a test pattern at step 600 which determines whether an unprocessed test pattern remains in time series.

When the existence of a test pattern has been confirmed (at step 600), the memory element input value has been fixed (at step 602) and a fault which is not yet detectable is selected (at step 604), the test pattern by which the selected fault is detectable for a combinational circuit is generated as an extended pattern (step 606). In this case, the conventional method can be applied to the generation of the extended pattern "as is".

When it is confirmed (YES at step 608) that the fault can be detected by the extended pattern, the extended pattern obtained at this time is added to the patterns obtained up to this time and is stored (step 610). The above process is repeated until all the faults are detected (step 612).

In this case, the process of generating a pattern becomes complicated and the volume of processing increases as compared with the case in which a random number is used. However, all the faults can be detected under the condition that the memory element input values are fixed, thereby increasing fault detection ratio.

Figure 11A:
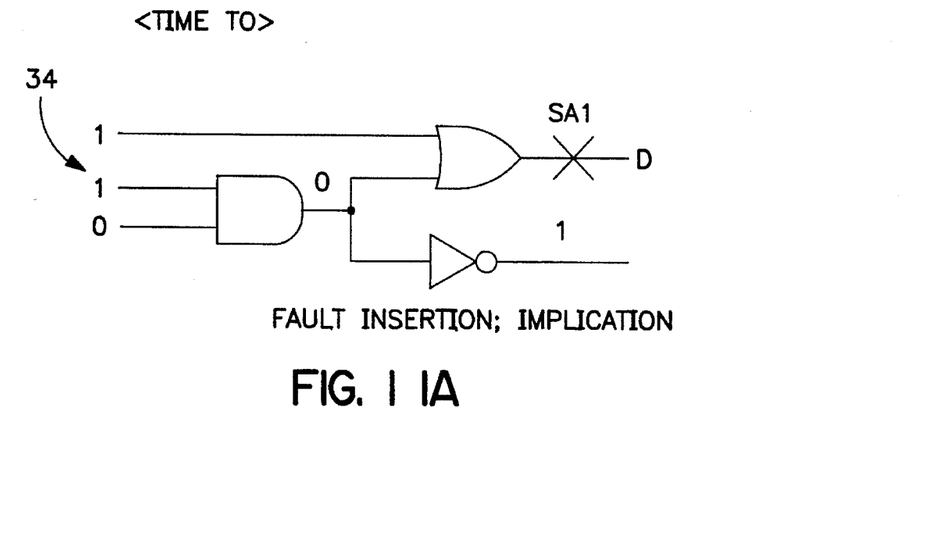
FIGS. 11A to 11C are explanatory views of the process of forming the extended pattern.
Figure 11B:
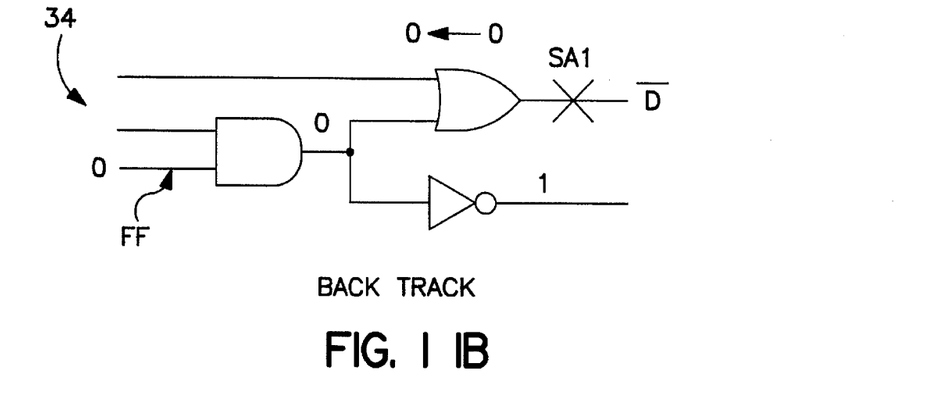
Figure 11C:
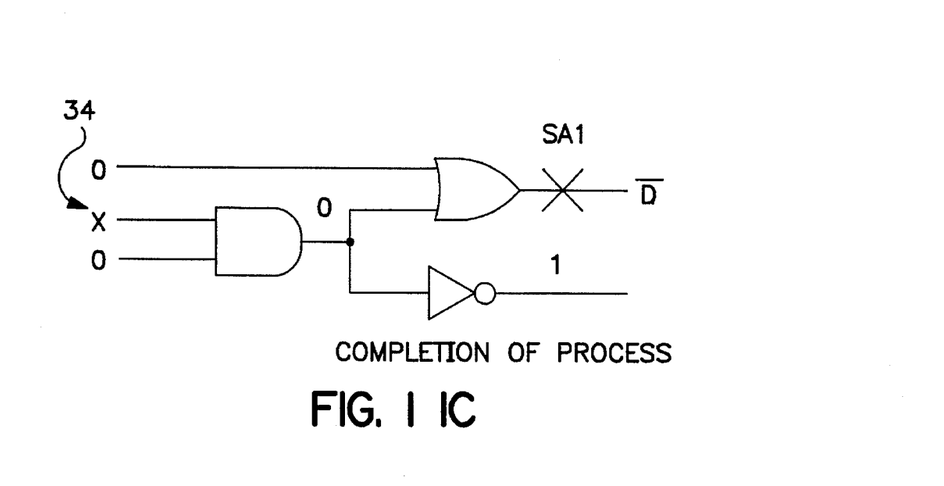

FIGS. 11A to 11C show an explanation of the process of generating the extended patterns. In FIG. 11A, when the test pattern is (1,1,0) at time T0, as is similar to the previous case, a 1 stuck-at fault at the OR gate output cannot be detected.

At this time, when the value 0, input from the D-FF (D-Flipflop) 4, is fixed and the 1 stuck-at fault at the OR gate output is selected (step 602, 604), the process (step 606) of generating a test pattern starts.

In this process, the output value 0 of the OR gate and inverter and the output value 1 of the inverter are obtained by implication. Then the gate input value enabling the output of the OR gate to be 0 is obtained.

At this time, as the other input value is made 0 by implication, the input value of the OR gate can be determined to be 0. Further, as the input to the OR gate is from the primary input, the primary input value is determined to be the same (FIG. 11B).

The output from an OR gate can be used as the primary output "as is", the test pattern (0,X) can be obtained as the extended pattern (at step 606), and the patterns (0,0) or (0,1) obtained by assigning 0 or 1 to X can be selected as actual extended patterns (step 610).

As is explained above, according to the present embodiment, since the method of extending the test pattern with regard to the primary input value is provided, the repetition of the test which is caused by a non-detection of the faults can be prevented.

Accordingly, the volume of processing is reduced and the fault test can be performed at a high efficiency and high speed. The time required for performing the test can be shortened and thus, the test is prevented from being stopped before completion. Therefore, the fault test can be completed within a predetermined time, even for a large scale circuit, resulting in an increase in the ratio of successful fault detections.

As is explained above, according to the present invention, respective test patterns are extended and thus, faults are prevented from going undetected. Repetitions of test are thereby avoided and the volume of test processing is reduced. Moreover, the time required for performing the test is shortened and the test is prevented from being stopped before completion. As a result, the ratio of successful fault detections is further increased, thereby raising the reliability of a circuit.

What is claimed is:

1. A method of testing for stuck-at faults of a synchronous circuit comprising a memory element and at least one combinational circuit, said method comprising the steps of:

expanding said synchronous circuit into a plurality of combinational circuits which are provided over time;

generating a test pattern for each of said combinational circuits, each test pattern comprising an input value and a primary input value for said each combinational circuit, the input value having an internal input value received from said memory element, said each test pattern being used to detect faults by being applied to said each combinational circuit, said each test pattern being formed in a sequence in an order in which the test pattern is applied to said synchronous circuit over time; and generating an expanded test pattern with other primary input values for detecting other faults with regard to said each test pattern, such that the internal input value to be applied from said memory element is fixed;

sequentially supplying each said test pattern having the internal input value and the primary input value to said each combinational circuit;

sequentially supplying each expanded test pattern generated for a corresponding test pattern to said each combinational circuit with the internal input value of the corresponding test pattern fixed when each said test pattern is applied to said each combinational circuit; and observing a primary output of said each combinational circuit when the test pattern and the expanded test pattern are applied to said each combinational circuit.

2. The method of testing for stuck-at faults of a synchronous circuit according to claim 1, wherein:

said primary input generating step generates said primary input value by generating a random number to perform a fault simulation of said combinational circuit based on using said random number.

3. The method of testing for the stuck-at fault synchronous circuit according to claim 2 wherein:

said method is applied to a non-scan testing process.

4. The method of testing for the stuck-at fault synchronous circuit according to claim 2 wherein:

said method is applied to a partial-scan testing process.

5. The method of testing for the stuck-at fault synchronous circuit according to claim 2 wherein:

said primary input generating step generates said primary input value in the same manner as said test pattern is generated.

6. The method according to claim 5 wherein:

said test pattern is generated by using a D-algorithm.

7. The method according to claim 5 wherein:

said test pattern is generated using a PODEM algorithm.

8. The method according to claim 5 wherein:

said process is applied to a non-scan method.

9. The method according to claim 5 wherein:

said process is applied to a partial-scan method.

10. A method of testing for stuck-at fault of a synchronous sequential circuit comprising at least one memory element and at least one combinational circuit, said method comprising steps of:

providing a time series test pattern to said synchronous sequential circuit by applying a system clock signal thereto;

determining whether a fault can be detected by using said time series test pattern;

changing a primary input value with regard to said time series test pattern without applying the system clock to said synchronous sequential circuit, thereby extending said time series test pattern;

applying said time series test pattern to said synchronous sequential circuit;

applying said extended time series test pattern to said synchronous sequential circuit without applying the system clock to said synchronous sequential circuit;

observing a first primary output value from said combinational circuit;

determining a first primary input value from said synchronous sequential circuit, based on the observation of said first primary output value by applying said system clock to the synchronous sequential circuit; and observing a second primary output value from said combination circuit when said system clock is applied to said synchronous sequential circuit, when the system clock is applied to said combinational circuit.

11. The method according to claim 10, further comprising the steps of:

applying at least one scan-in pattern to said synchronous sequential circuit so that said at least one scan-in pattern is applied to a selected memory element of said at least one memory element provided in the synchronous sequential circuit thereby performing a partial scan-in operation; and outputting a scan-out pattern when the primary output value is determined by applying the system clock to said synchronous sequential circuit.

12. A method of the testing for the generation of a fault of synchronous circuit comprising at least one memory element and at least one combinational circuit, said method comprising steps of:

providing a time series test pattern to said synchronous circuit by applying a system clock signal thereto;

determining whether a fault can be detected by using said time series test pattern; and changing an primary input value with regard to said time series test pattern without applying the system clock to said synchronous circuit, thereby extending said time series test pattern.

13. A method of testing for the generation of a fault of a synchronous sequential circuit comprising a memory element and a combinational circuit, said method comprising the steps of:

applying a time series test pattern to said synchronous sequential circuit;

applying an extended time series test pattern to said synchronous sequential circuit without applying a system clock to said synchronous sequential circuit;

observing a first primary output value from said combinational circuit;

determining a first primary input value based on the observation of said first primary output value by applying said system clock to said synchronous sequential circuit; and observing a second primary output value by applying said system clock to said synchronous sequential circuit when the system clock is applied to said combinational circuit.

* * * * *

UNITED STATES PATENT AND TRADEMARK OFFICE
CERTIFICATE OF CORRECTION

PATENT NO. : 5,502,729
DATED : March 26, 1996
INVENTOR(S) : Tsuneo NAKATA

It is certified that error appears in the above-indentified patent and that said Letters Patent is hereby corrected as shown below:

Column 2, line 41, change "or-1" to --ot-1--.

Column 8, line 6, before "An" insert --●--.

Column 10, line 52, delete "using"; and line 66, delete "by".

Column 11, line 3, change "method" to --process--; and line 5, change "method" to --process--.

Signed and Sealed this

Thirtieth Day of July, 1996

Attest:

BRUCE LEHMAN

*Attesting Officer*     *Commissioner of Patents and Trademarks*